US005925489A

United States Patent [19]

Kawabuchi et al.

[11] Patent Number: 5,925,489

[45] Date of Patent: Jul. 20, 1999

[54] HEAT-SENSITIVE RECORDING MATERIAL

[75] Inventors: Tatsuo Kawabuchi; Hiroshi Sato; Kimiatsu Nomura; Masanobu Takashima, all of Shizuoka-ken, Japan

[73] Assignee: Fuji Photo Film Co., Ltd., Kanagawa, Japan

[21] Appl. No.: 09/023,200

[22] Filed: Feb. 13, 1998

[30] Foreign Application Priority Data

| | | | |
|---|---|---|---|
| Feb. 20, 1997 | [JP] | Japan | 9-036666 |
| Sep. 25, 1997 | [JP] | Japan | 9-260336 |
| Jan. 16, 1998 | [JP] | Japan | 10-007068 |

[51] Int. Cl.[6] .............................. G03C 5/18; G03F 7/021

[52] U.S. Cl. .......................... 430/138; 430/157; 430/171; 430/179; 430/182

[58] Field of Search .................................... 430/138, 157, 430/171, 179, 182

[56] References Cited

U.S. PATENT DOCUMENTS

| | | | |
|---|---|---|---|
| 5,328,796 | 7/1994 | Shimomura et al. | 430/157 |
| 5,407,777 | 4/1995 | Shimada et al. | 430/138 |
| 5,773,186 | 6/1998 | Takashima | 430/138 |
| 5,866,293 | 2/1999 | Nomura et al. | 430/138 |

FOREIGN PATENT DOCUMENTS 6130600 10/1992 Japan .

OTHER PUBLICATIONS

Usami, et al., "UV–Fixable Diazo Type Thermal Recording Material" (Oct. 12, 1986).

Yoshida, et al., "Mechanism of Color Development for UV–Fixable Thermal Recording Material" (Oct. 12, 1986).

*Primary Examiner*—John S. Chu

*Attorney, Agent, or Firm*—Sughrue, Mion, Zinn, Macpeak & Seas, PLLC

[57] ABSTRACT

Disclosed is a heat-sensitive recording material comprising a substrate having thereon a heat-sensitive recording layer containing a diazonium salt compound and a coupler, pyrrolo[1,2-a] pyrimidine compound, as the coupler, being represented by the following general formula (1):

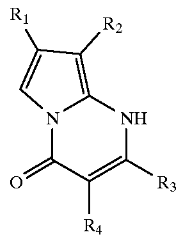

wherein $R^1$ to $R^4$ each represents a hydrogen atom, a halogen atom, an aryl group, an alkyl group, a cyano group, an acyl group, a substituted carbamoyl group, an alkoxycarbonyl group, an aryloxycarbonyl group, an acyloxy group, an alkoxy group, an aryloxy group, an alkylthio group, or an arylthio group.

The diazo-type heat-sensitive recording material, which develops a violet to cyan color, has excellent image stability and image fixing characteristics.

12 Claims, No Drawings

HEAT-SENSITIVE RECORDING MATERIAL

BACKGROUND OF THE INVENTION

1. Field of the Invention

The present invention relates to a heat-sensitive material in which a diazonium salt compound and a coupler are used as color developing components and, especially, to a novel diazo-heat-sensitive material of a type developing a violet to cyan color which has excellent image preservation characteristics and image fixing characteristics.

2. Description of the Related Art

Along with improvement in the performance of heat-sensitive recording materials, there is great demand for the development of heat-sensitive materials which can develop a violet to cyan color, have a long shelf life of a recording material, and are improved in image preservation characteristics and image fixing characteristics.

Diazonium salt compounds, which have an outstandingly high chemical activity, react with a compound, which is called a "coupler", such as phenol derivatives, compounds containing an active methylene group, and the like, to produce azo dyes with ease. Also, these compounds possess photosensitivity and hence these compounds are decomposed by irradiation with light to lose the activity. For these reasons, the diazonium salt compounds have been utilized since early times as optical recording materials typified by diazo copying (see "Fundamentals of Photographic Engineering, Edition of Non-silver Salt Photography" edited by Japan Photographic Association, Published by Corona Co., Ltd., pp.89–117 and 182–201 (1982)).

Also, the diazonium compound has been lately applied to recording materials requiring image fixing by making use of its characteristics in which it is decomposed by light to lose its activity. Its typical examples which have been proposed include photo-fixing type heat-sensitive recording materials comprising a diazonium salt compound and a coupler which are heated according to an image signal to allow to react with each other and thereby to form an image, followed by irradiating the image with light to fix the image (see Kohji Sato, et al, J. Image Electronic Society, Vol. 11, No. 4, pp.290–296 (1982)).

These recording materials containing the diazonium salt compound as a color developing component have the drawback that the shelf life of the recording material is short because the activity of the diazonium salt is so high that the diazonium salt gradually decomposes, even in the dark, and loses its reactivity. As a measure for improving this drawback, a method in which the diazonium salt compound is encapsulated in a microcapsule is exemplified. With this method, the diazonium salt compound can be isolated from materials, such as water, a base, and the like, which promote decomposition, and hence the shelf life of the recording material can be prolonged greatly(see Toshimasa Usami, et al, J. Electrophotography Association, Vol. 26, No. 2, pp.115–125 (1987)).

In the case where such a microcapsule having a wall made of a material such as a urea resin or a urethane resin possessing a glass transition temperature above room temperature is used, the capsule wall exhibits non-material permeability at room temperature but exhibits material permeability above the glass transition temperature. Therefore, microcapsules of this type, called "thermally responsive microcapsules", are useful in heat-sensitive recording materials. Specifically, thermal responsive microcapsules containing the diazonium salt compound and a heat-sensitive recording layer containing a coupler and a base are applied to the surface of a substrate to form a recording material. With this structure, the diazonium salt compound can be kept for long periods in a stable manner and color images developed are formed readily by heating. Also, it is possible to fix the image by light irradiation.

As aforementioned, the microencapsulation ensures that the stability of the diazonium salt compound is outstandingly improved.

Meanwhile, it is known that 2-hydroxy-3-naphthoic acid anilides exhibit excellent performance as the heat-sensitive recording color forming material and create a blue color dye through a coupling reaction with a 4-substituted amino-2-alkoxybenzodiazonium salt compound (see Japanese Patent Application Laid-Open (JP-A) No. 2-225082).

However, the diazonium salt compound has the drawback that the use of a diazonium salt compound possessing $\lambda_{max}$ at a longer wavelength side causes a reduction in storability (coloring characteristics on background during storage prior to copying) . Also, there are the drawbacks that the use of a diazonium salt compound possessing $\lambda_{max}$ at a shorter wavelength side causes the fixing of an image to be hindered when irradiating with light if the above coupler is used and causes insufficiency in the preparation of a color of a longer wavelength extending to a cyan color and in the characteristics of preserving a developed color image (lightfastness).

As aforementioned, heat-sensitive recording materials, which possess the characteristics of developing a violet to cyan color and have excellent shelf life, image preservation characteristics, and image fixing characteristics, have not yet been developed.

SUMMARY OF THE INVENTION

The present invention has been achieved in view of this situation and has an object of providing a novel diazo-heat-sensitive recording material of a type forming a violet to cyan color, which has an excellent shelf life, image preservation characteristics, and image fixing characteristics.

The present inventors directed their attention especially to a coupler and a diazonium salt compound and conducted earnest studies to achieve the above object. As a result, the present inventors learned that a heat-sensitive recording material obtained by the following measures was improved in image preservation characteristics and image fixing characteristics and had excellent characteristics of forming a violet to cyan color to complete the present invention.

Accordingly, the above object can be attained in the present invention by the provision of a heat-sensitive recording material comprising a substrate having thereon a heat-sensitive recording layer containing a diazonium salt compound and a coupler, which reacts with the diazonium salt compound upon heating to develop a color, in which the coupler includes at least one type of pyrrolo[1,2-a] pyrimidine compounds represented by the following general formula (1):

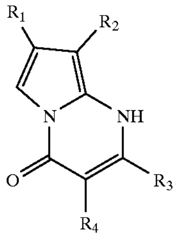

wherein $R^1$ to $R^4$ each represents a hydrogen atom, a halogen atom, an aryl group, an alkyl group, a cyano group, an acyl group, a substituted carbamoyl group, an alkoxycarbonyl group, an aryloxycarbonyl group, an acyloxy group, an alkoxy group, an aryloxy group, an alkylthio group, an arylthio group, a substituted sulfamoyl group, an alkylsulfonyl group, an arylsulfonyl group, an alkylphosphoryl group, an arylphosphoryl group, or a substituted amino group.

DETAILED DESCRIPTION OF THE PREFERRED EMBODIMENTS

The present invention will now be explained in detail.

The coupler used in the present invention is a compound represented by the above general formula (1).

In the general formula (1), $R^1$ to $R^4$ each represents a hydrogen atom, a halogen atom, an aryl group, an alkyl group, a cyano group, an acyl group, a substituted carbamoyl group, an alkoxycarbonyl group, an aryloxycarbonyl group, an acyloxy group, an alkoxy group, an aryloxy group, an alkylthio group, an arylthio group, a substituted sulfamoyl group, an alkylsulfonyl group, an arylsulfonyl group, an alkylphosphoryl group, an arylphosphoryl group, or a substituted amino group.

Among these groups, as for substituents represented by $R^1$ and $R^2$, it is preferable that at least one of $R^1$ and $R^2$ be an electron attractive group having a Hammet's substitution group constant $\sigma_p$ of 0.20 or more and it is more preferable that at least one of $R^1$ and $R^2$ be an electron attractive group having a Hammet's substitution group constant $\sigma_p$ of 0.35 or more.

Among the electron attractive groups with a value $\sigma_p$ of 0.20 or more, a cyano group (a value $\sigma_p$ of 0.66), a perfluoroalkyl group (for example, a trifluoromethyl group with a value $\sigma_p$ of 0.54), an acyl group (for example, an acetyl group with a value $\sigma_p$ of 0.50 and a benzoyl group with a value $\sigma_p$ of 0.43), a carbamoyl group (a value $\sigma_p$ of 0.36), and the like are given as preferable examples, though they are not limited to these groups.

Examples of the halogen atom include a fluorine atom, chlorine atom, bromine atom, and the like. Among these, a fluorine atom and a chlorine atom are preferable.

In the substituted groups represented by $R^1$ to $R^4$, the aryl group may be substituted with an alkyl group, alkoxy group, aryloxy group, halogen atom, nitro group, cyano group, substituted carbamoyl group, substituted sulfamoyl group, substituted amino group, substituted oxycarbamoyl group, substituted oxysulfonyl group, alkylthio group, arylthio group, alkylsulfonyl group, arylsulfonyl group, aryl group, hydroxyl group, acyl group, acyloxy group, substituted sulfonyloxy group, substituted aminocarbonyloxy group, or substituted phosphoryloxy group.

As the aryl group, aryl groups having 6–30 carbon atoms are preferable. Examples of these aryl groups include a phenyl group, 2-methylphenyl group, 2-chlorophenyl group, 2-methoxyphenyl group, 2-ethoxyphenyl group, 2-propoxyphenyl group, 2-isopropoxyphenyl group, 2-butoxyphenyl group, 2-(2-ethylhexyloxy)phenyl group, 2-octyloxyphenyl group, 2-undecyloxyphenyl group, 2-trifluoromethylphenyl group, 2-(2-ethylhexyloxy)-5-chlorophenyl group, 2,2'-hexyloxy-3,5-dichlorophenyl group, 3-(2,4-di-t-pentylphenoxyethoxy)phenyl group, 2-(dibutylaminocarbonylethoxy)phenyl group, 2,4-dichlorophenyl group, 2,5-dichlorophenyl group, 2,4,6-trimethylphenyl group, 3 -chlorophenyl group, 3-nitrophenyl group, 3 -cyanophenyl group, 3 - trifluoromethylphenyl group, 3-methoxyphenyl group, 3-ethoxyphenyl group, 3-butoxyphenyl group, 3-(2'-ethylhexyloxy)phenyl group, 3,4-dichlorophenyl group, 3,5-dichlorophenyl group, 3,4-dimethoxyphenyl group, 3,5-dibutoxyphenyl group, 3-octyloxyphenyl group, 3-(dibutylaminocarbonylmethoxy)phenyl group, 3-(di-2-ethylhexylaminocarbonylmethoxy)phenyl group, 3-dodecyloxyphenyl group, 4-chlorophenyl group, 4-cyanophenyl group, 4-nitrophenyl group, 4-trifluoromethylphenyl group, 4-methoxyphenyl group, 4-ethoxyphenyl group, 4-isopropoxyphenyl group, 4-butoxyphenyl group, 4-(2-ethylhexyloxy)phenyl group, 4-isopentyloxyphenyl group, 4-(octadecyloxy)phenyl group, 4-benzylphenyl group, 4-aminosulfonylphenyl group, 4-N,N-dibutylsulfonylphenyl group, 4-ethoxycarbonylphenyl group, 4-(2-ethylhexyloxycarbonyl)phenyl group, 4-t-octylphenyl group, 4-fluorophenyl group, 3-acetylphenyl group, 2-acetylaminophenyl group, 2,4-di-t-pentylphenyl group, 4-(2-ethylhexyloxy)carbonylphenyl group, 4-methylthiophenyl group, 4-(4-chlorophenylthio)phenyl group, hydroxyphenyl group, phenylsulfonylphenyl group, phenylsulfonyloxyphenyl group, phenylcarbonyloxyphenyl group, dimethylaminocarbonyloxyphenyl group, and butylcarbonyloxyphenyl group. In the substituted groups represented by $R^1$ to $R^4$, the alkyl group may be either a linear or branched and may have a unsaturated bond. Also, these alkyl groups may be substituted with an alkoxy group, aryloxy group, alkoxycarbonyl group, aryloxycarbonyl group, aryl group, hydroxy group, halogen atom, or the like. In these groups, the aryl group may be further substituted with an alkyl group, alkoxy group, nitro group, cyano group, hydroxy group, or halogen atom.

As the alkyl group, alkyl groups having 1–30 carbon atoms are preferable. Examples of these alkyl groups include a methyl group, trifluoromethyl group, ethyl group, butyl group, hexyl group, octyl group, 2-ethylhexyl group, decyl group, dodecyl group, octadecyl group, propyl group, isopropyl group, isobutyl group, sec-butyl group, t-butyl group, pentyl group, 1-ethylpentyl group, cyclopentyl group, cyclohexyl group, isopentyl group, heptyl group, nonyl group, undecyl group, propenyl group, heptadecenyl group, t-octyl group, ethoxycarbonylmethyl group, butoxycarbonylmethyl group, 2-ethylhexyloxycarbonylmethyl group, 1-(ethoxycarbonyl)ethyl group, 2',4'-diisopentylphenyloxymethyl group, 2',4'-di-t-butylphenyloxymethyl group, ethoxycarbonylethyl group, 2-ethylhexyloxycarbonylethyl group, butyldecyloxycarbonylethyl group, dibutylaminocarbonylmethyl group, dibenzylaminocarbonylethyl group, ethyloxycarbonylpropyl group, 2-ethylhexyloxycarbonylpropyl group, 2,4-di-t-amylphenyloxypropyl group, 1-(2',4'-di-t-amylphenyloxy)propyl group, 2,4-di-t-butylphenyloxypropyl group, acetylaminoethyl group, N,N-dihexylaminocarbonylethyl group, 2,4-di-t-amyloxyethyloxycarbonylpropyl group, isostearyloxycarbonylpropyl group, 1-(2,4-di-t-pentylphenyloxy) propyl group, 2,4-di-t-pentylphenyloxyethyloxycarbonylpropyl group, naphthyloxyethyloxycarbonylethyl group, N-methyl-N-phenylethyloxycarbonylethyl group, and methanesulfonylaminopropyl group, and the like.

In the substituted groups represented by $R^1$ to $R^4$, as the acyl group, acyl groups having 2–20 carbon atoms are preferable. Examples of these acyl groups include an acetyl group, propanoyl group, butanoyl group, hexanoyl group, octanoyl group, 2-ethylhexanoyl group, decanoyl group, dodecanoyl group, octadecanoyl group, 2-cyanopropanoyl group, and 1,1-dimethylpropanoyl group, and the like.

In the substituted groups represented by $R^1$ to $R^4$, the substituted carbamoyl groups include a carbamoyl group, N-alkylcarbamoyl group, N-arylcarbamoyl group, N,N-dialkylcarbamoyl group, N,N-diarylcarbamoyl group, N-alkyl-N-arylcarbamoyl group, and the like.

As the substituted carbamoyl group, those having 1–30 carbon atoms are preferable. Examples of these carbamoyl groups include an N-methylcarbamoyl group, N-ethylcarbamoyl group, N-propylcarbamoyl group, N-butylcarbamoyl group, N-hexylcarbamoyl group, N-cyclohexylcarbamoyl group, N-octylcarbamoyl group, N-2-ethylhexylcarbamoyl group, N-decylcarbamoyl group, N-octadecylcarbamoyl group, N-phenylcarbamoyl group, N-2-methylphenylcarbamoyl group, N-2-chlorophenylcarbamoyl group, N-2-methoxyphenylcarbamoyl group, N-2-isopropoxyphenylcarbamoyl group, N-2-(2-ethylhexyloxy) phenylcarbamoyl group, N-3-chlorophenylcarbamoyl group, N-3-nitrophenylcarbamoyl group, N-3-cyanophenylcarbamoyl group, N-4-methoxycarbamoyl group, N-4-(2'-ethylhexyloxy)phenylcarbamoyl group, N-4-cyanophenylcarbamoyl group, N-methyl-N-phenylcarbamoyl group, N,N-dimethylcarbamoyl group, N,N-dibutylcarbamoyl group, and N,N-diphenylcarbamoyl group, and the like.

In the substituted groups represented by $R^1$ to $R^4$, as the alkoxycarbonyl group, those having 2–20 carbon atoms are preferred. Examples of these alkoxy groups include a methoxycarbonyl group, ethoxycarbonyl group, propoxycarbonyl group, butoxycarbonyl group, hexyloxycarbonyl group, 2-ethylhexyloxycarbonyl group, octyloxycarbonyl group, decyloxycarbonyl group, octadecyloxycarbonyl group, phenyloxyethyloxycarbonyl group, phenyloxypropyloxycarbonyl group, 2,4-di-t-amylphenyloxyethylcarbonyl group, 2,6-di-t-butyl-4-methylcyclohexyloxycarbonyl group, and isostearyloxycarbonyl group, and the like.

In the substituted groups represented by $R^1$ to $R^4$, as the aryloxycarbonyl group, those having 7–30 carbon atoms are desirable. Examples of these aryloxycarbonyl groups include 2-methylphenyloxycarbonyl group, 2-chlorophenyloxycarbonyl group, 2,6-dimethylphenyloxycarbonyl group, 2,4,6-trimethylphenyloxycarbonyl group, 2-methoxyphenyloxycarbonyl group, 2-butoxyphenyloxycarbonyl group, 3-cyanophenyloxycarbonyl group, 3-nitrophenyloxycarbonyl group, 2,2-ethylhexylphenyloxycarbonyl group, 3-(2-ethylhexyloxy) phenyloxycarbonyl group, 4-fluorophenyloxycarbonyl group, 4-chlorophenyloxycarbonyl group, 4-cyanophenyloxycarbonyl group, and 4-butoxyphenylcarbonyl group, and the like.

In the substituted groups represented by $R^1$ to $R^4$, as the acyloxy group, those having 2–20 carbon atoms are preferable. Examples of these acyloxy groups include an acetyloxy group, propanoyloxy group, butanoyloxy group, pentanoyloxy group, trifluoromethylcarbonyloxy group, octanoyloxy group, decanoyloxy group, undecanoyloxy group, and octadecanoyloxy group, and the like.

In the substituted groups represented by $R^1$ to $R^4$, as the alkoxy group, those having 1–30 carbon atoms are preferable. Examples of these alkoxy groups include a methoxy group, ethoxy group, propyloxy group, isopropyloxy group, butoxy group, isobutoxy group, sec-butoxy group, t-butoxy group, pentyloxy group, isopentyloxy group, hexyloxy group, heptyloxy group, octyloxy group, 2-ethylhexyloxy group, decyloxy group, dodecyloxy group, octadecyloxy group, ethoxycarbonylmethyloxy group, 2-ethylhexyloxycarbonylmethyloxy group, aminocarbonylmethyloxy group, N,N-dibutylaminocarbonylmethyloxy group, N-methylaminocarbonylmethyloxy group, N-ethylaminocarbonylmethyloxy group, N-octylaminocarbonylmethyloxy group, N-methyl-N-benzylaminocarbonylmethyloxy group, benzyloxy group, and cyanomethyloxy group, and the like.

In the substituted groups represented by $R^1$ to $R^4$, as the aryloxy group, those having 6–30 carbon atoms are preferable. Examples of these aryloxy groups include a phenyloxy group, 1-naphthyloxy group, 2-naphthyloxy group, 2-chlorophenyloxy group, 2-methylphenyloxy group, 2-methoxyphenyloxy group, 2-butoxyphenyloxy group, 3-chlorophenyloxy group, 3-trifluoromethylphenyloxy group, 3-cyanophenyloxy group, 3-(2-ethylhexyloxy) phenyloxy group, 3-nitrophenyloxy group, 4-fluorophenyloxy group, 4-cyanophenyloxy group, 4-butoxyphenyloxy group, 4-(2-ethylhexyloxy)phenyloxy group, and 4-octadecylphenyloxy group, and the like.

In the substituted groups represented by $R^1$ to $R^4$, as the alkylthio group, those having 1–30 carbon atoms are preferable. Examples of these alkylthio groups include a methylthio group, ethylthio group, propylthio group, isopropylthio group, butylthio group, isobutylthio group, sec-butylthio group, t-butylthio group, pentylthio group, isopentylthio group, hexylthio group, heptylthio group, octylthio group, 2-ethylhexylthio group, decylthio group, dodecylthio group, octadecylthio group, ethoxycarbonylmethylthio group, 2-ethylhexyloxycarbonylmethylthio group, aminocarbonylmethylthio group, N,N-dibutylaminocarbonylmethylthio group, N-methylaminocarbonylmethylthio group, N-ethylaminocarbonylmethylthio group, N-octylaminocarbonylmethylthio group, N-methyl-N-benzylaminocarbonylmethylthio group, benzylthio group, and cyanomethylthio group, and the like.

In the substituted groups represented by $R^1$ to $R^4$, as the arylthio group, those having 6–30 carbon atoms are preferred. Examples of these arylthio groups include a phenylthio group, 1-naphthylthio group, 2-naphthylthio group, 2-chlorophenylthio group, 2-methylphenylthio group, 2-methoxyphenylthio group, 2-butoxyphenylthio group, 3-chlorophenylthio group, 3 - trifluoromethylphenylthio group, 3-cyanophenylthio group, 3-(2-ethylhexyloxy) phenylthio group, 3-nitrophenylthio group, 4-fluorophenylthio group, 4-cyanophenylthio group, 4-butoxyphenylthio group, 4-(2-ethylhexyloxy)phenylthio group, and 4-octadecylphenylthio group, and the like.

In the substituted groups represented by $R^1$ to $R^4$, examples of the substituted sulfamoyl group include a sulfamoyl group, N-alkylsulfamoyl group, N-arylsulfamoyl group, N,N-dialkylsulfamoyl group, N,N-diarylsulfamoyl group, and N-alkyl-N-arylsulfamoyl group.

In the substituted groups represented by $R^1$ to $R^4$, substituted sulfamoyl groups having 0 to 30 carbon atoms are preferably used. Examples of such a substituted sulfamoyl group include an N-methylsulfamoyl group, N-ethylsulfamoyl group, N-propylsulfamoyl group, N-butylsulfamoyl group, N-hexylsulfamoyl group, N-cyclohexylsulfamoyl group, N-octylsulfamoyl group, N-2-ethylhexylsulfamoyl group, N-decylsulfamoyl group, N-octadecylsulfamoyl group, N-phenylsulfamoyl group, N-2-methylphenylsulfamoyl group, N-2-chlorophenylsulfamoyl group, N-2-methoxyphenylsulfamoyl group, N-2-isopropoxyphenylsulfamoyl group, N-2-(2-ethylhexyloxy)phenylsulfamoyl group, N-3-chlorophenylsulfamoyl group, N-3-nitrophenylsulfamoyl group, N-3- cyanophenylsulfamoyl group, N-4-methoxysulfamoyl group, N-4-(2-ethylhexyloxy)phenylsulfamoyl group, N-4-cyanophenylsulfamoyl group, N-methyl-N-phenylsulfamoyl group, N,N-dimethylsulfamoyl group, N,N-dibutylsulfamoyl group, N,N-diphenylsulfamoyl group, and N,N-di-(2-ethylhexyl)sulfamoyl group.

In the substituted groups represented by $R^1$ to $R^4$, alkylsulfonyl groups having 1 to 20 carbon atoms are preferably used. Examples of such an alkylsulfonyl group include a methylsulfonyl group, ethylsulfonyl group, propylsulfonyl group, isopropylsulfonyl group, butylsulfonyl group, hexylsulfonyl group, cyclohexylsulfonyl group, octylsulfonyl group, 2-ethylhexylsulfonyl group, decanoylsulfonyl group, dodecanoylsulfonyl group, octadecanoylsulfonyl group, and cyanomethylsulfonyl group.

In the substituted groups represented by $R^1$ to $R^4$, arylsulfonyl groups having 6 to 30 carbon atoms are preferably used. Examples of such an arylsulfonyl group include a phenylsulfonyl group, 1-naphthylsulfonyl group, 2-naphthylsulfonyl group, 2-chlorophenylsulfonyl group, 2-methylphenylsulfonyl group, 2-methoxyphenylsulfonyl group, 2-buthoxyphenylsulfonyl group, 3-chlorophenylsulfonyl group, 3-trifluoromethylphenylsulfonyl group, 3-cyanophenylsulfonyl group, 3-(2-ethylhexyloxy)phenylsulfonyl group, 3-nitrophenylsulfonyl group, 4- fluorophenylsulfonyl group, 4-cyanophenylsulfonylgroup, 4-butoxyphenylsulfonylgroup, 4-(2-ethylhexyloxy)phenylsulfonyl group, and 4-octadecylphenylsulfonyl group.

In the substituted groups represented by $R^1$ to $R^4$, alkylphosphoryl groups having 2 to 40 carbon atoms are preferably used. Examples of such an alkylphosphoryl group include a methylphosphoryl group, ethylphosphoryl group, propylphosphoryl group, isopropylphosphoryl group, butylphosphoryl group, isobutylphosphoryl group, sec-butylphosphoryl group, t-butylphosphoryl group, pentylphosphoryl group, isopentylphosphoryl group, hexylphosphoryl group, heptylphosphoryl group, octylphosphoryl group, 2-ethylhexylphosphoryl group, decylphosphoryl group, dodecylphosphoryl group, octadecylphosphoryl group, ethoxycarbonylmethylphosphoryl group, 2-ethylhexyloxycarbonylmethylphosphoryl group, aminocarbonylmethylphosphoryl group, N,N-dibutylaminocarbonylmethylphosphoryl group, N-methylaminocarbonylmethylphosphoryl group, N-ethylaminocarbonylmethylphosphoryl group, N-octylaminocarbonylmethylphosphoryl group, and benzylphosphoryl group.

In the substituted groups represented by $R^1$ to $R^4$, arylphosphoryl groups having 12 to 50 carbon atoms are preferably used. Examples of such an arylphosphoryl group include a phenylphosphoryl group, 1-naphthylphosphoryl group, 2-naphthylphosphoryl group, 2-chlorophenylphosphoryl group, 2-methylphenylphosphoryl group, 2-methoxyphenylphosphoryl group, 2-butoxyphenylphosphoryl group, 3-chlorophenylphosphoryl group, 3-trifluoromethylphenylphosphoryl group, 3-cyanophenylphosphoryl group, 3-(2-ethylhexyloxy)phenylphosphoryl group, 3-nitrophenylphosphoryl group, 4-fluorophenylphosphoryl group, 4-cyanophenylphosphoryl group, 4-butoxyphenylphosphoryl group, 4-(2-ethylhexyloxy)phenylphosphoryl group, and 4-octadecylphenylphosphoryl group.

As the substituted amino groups in the substituted groups represented by $R^1$ to $R^4$, an amino group, N-alkylamino group, N-arylamino group, N-acylamino group, N-sulfonylamino group, N,N-dialkylamino group, N,N-diarylamino group, N-alkyl-N-arylamino group, N,N-disulfonylamino group, and the like are exemplified.

Substituted amino groups having 0 to 50 carbon atoms are preferably used as the substituted amino groups. Examples of such a substituted amino group include a N-methylamino group, N-ethylamino group, N-propylamino group, N-isopropylamino group, N-tert-butylamino group, N-hexylamino group, N-cyclohexylamino group, N-octylamino group, N-2-ethylhexylamino group, N-decylamino group, N-octadecylamino group, N-benzylamino group, N-phenylamino group, N-2-methylphenylamino group, N-2-chlorophenylamino group, N-2-methoxyphenylamino group, N-2-isopropoxyphenylamino group, N-2-(2-ethylhexyloxy)phenylamino group, N-3-chlorophenylamino group, N-3-nitrophenylamino group, N-3-cyanophenylamino group, N-4-methoxyamino group, N-4-(2'-ethylhexyloxy)phenylamino group, N-4-cyanophenylamino group, N-methyl-N-phenylamino group, N,N-dimethylamino group, N,N-dibutylamino group, N,N-diphenylamino group, N,N-diacetylamino group, N,N-dibenzoylamino group, N,N-(dibutylcarbonyl)amino group, N,N-(di-2-ethylhexylcarbonyl)amino group, N,N-(dimethylsulfonyl)amino group, N,N-(diethylsulfonyl) amino group, N,N-(dibutylsulfonyl)amino group, N,N-(2-ethylhexylsulfonyl)amino group, and N,N-(diphenylsulfonyl)amino group.

Typical examples of the pyrrolopyrimidine compound represented by the general formula (1), which is the coupler used in the present invention, are given in the following, though the couplers of the present invention are not limited to these examples. Substituents used in compound examples are now described and combinations of these substituents are shown in Tables 1 and 2. In the tables, numerals described in the columns of $R^1$ to $R^4$ indicate numbers of the substituents.

(5)

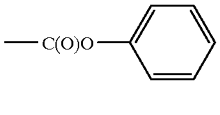

-continued
(20)
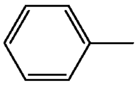
(21)
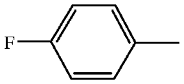
(22)
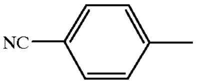
(23)
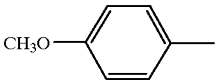
(24)
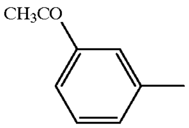
(25)
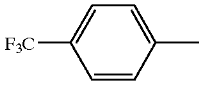
(26)
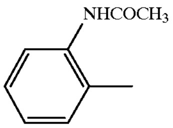
(27)
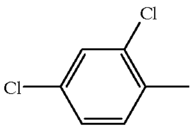
(28)
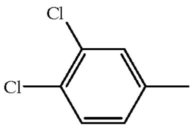
(29)
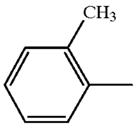
(30)
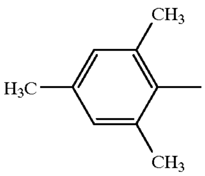
(31)
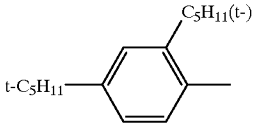
(32)
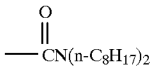
(33)
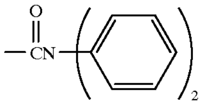
(34)
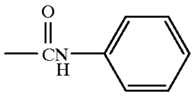
(35)
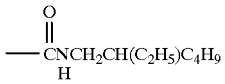
(37)
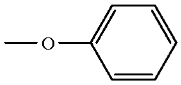
(39)
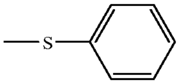
(41)
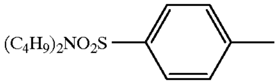
(43)
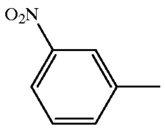
(44)
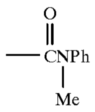

-continued
(45)
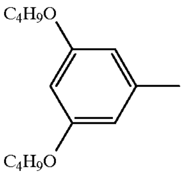
(46)
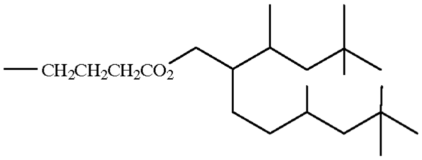
(49)
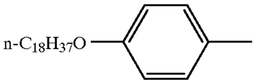
(50)
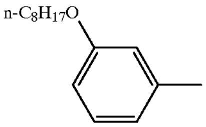
(51)
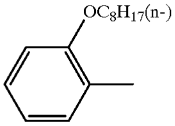
(52)
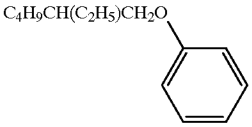
(53)
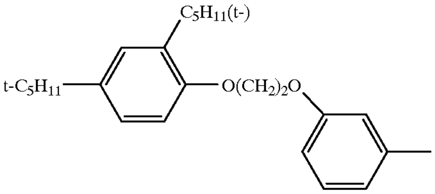
(54)
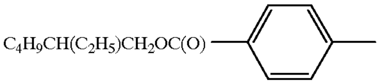
(55)
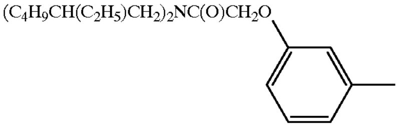
-continued
(56)
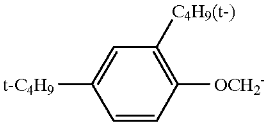
(57)
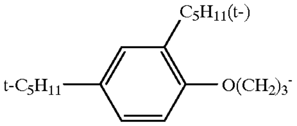
(58)
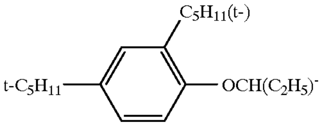
(59)
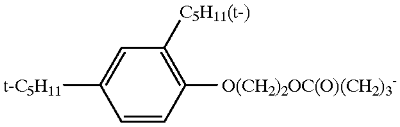
TABLE 1
| Coupler No. | $R^1$ | $R^2$ | $R^3$ | $R^4$ |
|---|---|---|---|---|
| (1) | (20) | (3) | (1) | (1) |
| (2) | (20) | (3) | (10) | (1) |
| (3) | (20) | (3) | (10) | (2) |
| (4) | (20) | (3) | (10) | (10) |
| (5) | (20) | (4) | (10) | (20) |
| (6) | (4) | (4) | (10) | (1) |
| (7) | (4) | (3) | (20) | (1) |
| (8) | (5) | (3) | (10) | (1) |
| (9) | (6) | (3) | (15) | (1) |
| (10) | (7) | (3) | (12) | (1) |
| (11) | (8) | (3) | (10) | (1) |
| (12) | (9) | (3) | (10) | (1) |
| (13) | (10) | (3) | (16) | (1) |
| (14) | (10) | (3) | (13) | (1) |
| (15) | (11) | (3) | (20) | (1) |
| (16) | (20) | (3) | (16) | (1) |
| (17) | (20) | (3) | (14) | (10) |
| (18) | (17) | (3) | (20) | (1) |
| (20) | (20) | (3) | (56) | (1) |
| (21) | (20) | (3) | (19) | (1) |
| (22) | (20) | (3) | (59) | (1) |
| (23) | (20) | (3) | (57) | (1) |
| (24) | (52) | (3) | (58) | (1) |
| (25) | (52) | (3) | (57) | (1) |
| (26) | (20) | (3) | (16) | (1) |
| (27) | (20) | (3) | (15) | (10) |
| (28) | (20) | (3) | (15) | (2) |
| (29) | (18) | (3) | (20) | (1) |
| (30) | (21) | (3) | (16) | (1) |
TABLE 2
| Coupler No. | $R^1$ | $R^2$ | $R^3$ | $R^4$ |
|---|---|---|---|---|
| (31) | (22) | (3) | (16) | (1) |
| (32) | (20) | (3) | (23) | (1) |
| (33) | (24) | (3) | (13) | (2) |
| (34) | (25) | (3) | (10) | (10) |
| (35) | (26) | (3) | (10) | (20) |
| (36) | (30) | (3) | (13) | (1) |
| (37) | (31) | (3) | (13) | (1) |

TABLE 2-continued

| Coupler No. | $R^1$ | $R^2$ | $R^3$ | $R^4$ |
|---|---|---|---|---|
| (38) | (27) | (3) | (49) | (1) |
| (39) | (20) | (3) | (50) | (1) |
| (40) | (54) | (3) | (10) | (1) |
| (41) | (20) | (3) | (53) | (1) |
| (42) | (20) | (3) | (52) | (1) |
| (43) | (20) | (3) | (51) | (1) |
| (44) | (25) | (3) | (16) | (1) |
| (45) | (52) | (3) | (13) | (1) |
| (46) | (53) | (3) | (13) | (1) |
| (47) | (27) | (3) | (16) | (10) |
| (48) | (27) | (3) | (57) | (1) |
| (49) | (28) | (3) | (55) | (1) |
| (50) | (28) | (3) | (16) | (1) |
| (51) | (29) | (3) | (16) | (1) |
| (52) | (29) | (33) | (10) | (1) |
| (53) | (29) | (34) | (16) | (1) |
| (54) | (29) | (35) | (10) | (1) |
| (55) | (29) | (3) | (10) | (20) |
| (56) | (20) | (3) | (46) | (1) |
| (57) | (22) | (32) | (10) | (1) |
| (58) | (20) | (3) | (10) | (36) |
| (59) | (20) | (40) | (10) | (1) |
| (60) | (20) | (3) | (10) | (38) |

These pyrrolopyrimidine compounds represented by the general formula (1) may be used either singly or in combinations of two or more.

The coupler according to the present invention couples with a diazo compound in a basic and/or neutral atmosphere to form a dye. It may be used in combination with a known coupler depending on a variety of objects such as color adjustment and the like. The coupler to be combined includes the so-called active methylene compounds containing a methylene group adjoining a carbonyl group; phenol derivatives; naphthol derivatives; and the like. As typical examples of the couplers to be combined, the following compounds are given and used to the extent that the use of these compounds conforms with the object of the present invention.

Preferable examples of the couplers to be combined in the present invention include resorcinol, fluoroglycine, 2,3-dihydroxynaphthalene, sodium 2,3-dihydroxynaphthalene-6-sulfonate, 1-hydroxy-2-naphthoic acid morpholinopropylamide, sodium 2-hydroxy-3-naphthalene sulfonate, 2-hydroxy-3-naphthalenesulfonic acid anilide, 2-hydroxy-3-naphthalenesulfonic acid morpholinopropylamide, 2-hydroxy-3-naphthalenesulfonic acid-2-ethylhexyloxypropylamide, 2-hydroxy-3-naphthalenesulfonic acid-2-ethylhexylamide, 5-acetamide-1-naphthol, sodium 1-hydroxy-8-acetamidenaphthalene-3,6-disulfonate, 1-hydroxy-8-acetamidenaphthalene-3,6-disulfonic acid dianilide, 1,5-dihydroxynaphthalene, 2-hydroxy-3-naphthoic acid morpholinopropylamide, 2-hydroxy-3-naphthoic acid octylamide, 2-hydroxy-3-naphthoic acid anilide, 5,5-dimethyl-1,3-cyclohexane-dione, 1,3-cyclopentane-dione, 5-(2-n-tetradecyloxyphenyl)-1,3-cyclohexane-dione, 5-phenyl-4-methoxycarbonyl-1,3-cyclohexane-dione, 5-(2,5-di-n-octyloxyphenyl)-1,3-cyclohexane-dione, N,N'-dicyclohexylbarbituric acid, N,N'-di-n-dodecylbarbituric acid, N-n-octyl-N'-n-octadecylbarbituric acid, N-phenyl-N'-(2,5-di-n-octyloxyphenyl)barbituric acid, N,N'-bis(octadecyloxycarbonylmethyl)barbituric acid, 1-phenyl-3-methyl-5-pyrazolone, 1-(2,4,6-trichlorophenyl)-3-anilino-5-pyrazolone, 1-(2,4,6-trichlorophenyl)-3-benzamide-5-pyrazolone, 6-hydroxy-4-methyl-3-cyano-1-(2-ethylhexyl)-2-pyridone, 2,4-bis-(benzoylacetamide)toluene, 1,3-bis- (pivaloylacetamidemethyl)benzene, benzoylacetonitrile, thenoylacetonitrile, acetoacetoanilide, benzoylacetoanilide, pivaloylacetoanilide, 2-chloro-5-(N-n-butylsulfamoyl)-1-pivaloylacetamidebenzene, 1-(2-ethylhexyloxypropyl)-3-cyano-4-methyl-6-hydroxy-1,2-dihydropyridin-2-one, 1-(dodecyloxypropyl)-3-acetyl-4-methyl-6-hydroxy-1,2-dihydropyridin-2-one, and 1-(4-n-octyloxyphenyl)-3-tert-butyl-5-aminopyrazole, and the like.

Details of the coupler are described in Japanese Patent Application Laid-Open (JP-A) Nos. 4-201483, 7-223367, 7-223368,7-323660, Japanese Patent Application Nos. 5-278608, 5-297024, 6-18669, 6-18670, 7-316280, 8-027095, 8-027096, 8-030799, 8-12610, 8-132394, 8-358755, 8-358756, and 9-069990 and the like.

The amount of the coupler to be added in the heat-sensitive recording layer is from 0.02 to 5 $g/m^2$, and preferably from 0.1 to 4 $g/m^2$, in consideration of the effect. An amount of less than 0.02 $g/m^2$ and an amount exceeding 5 $g/m^2$ are undesirable because of decrease in color development and deterioration in coating characteristics respectively.

The diazonium salt compounds which can be used in the present invention are compounds represented by the following general formula:

$$Ar—N_2^+X^-$$

wherein Ar represents an aromatic moiety and $X^-$ represents an acid anion. The compound reacts with by coupling with the coupler upon heating to form a color, and decomposes by irradiation with light. The maximum absorption wavelength of these compounds can be controlled by selecting the position and type of substituents on the Ar moiety.

Specific examples of diazonium, which forms a salt, include 4-(p-tolylthio)-2,5-dibutoxybenzenediazonium, 4-(4-chlorophenylthio)-2,5-dibutoxybenzenediazonium, 4-(N,N-dimethylamino)benzenediazonium, 4-(N,N-diethylamino)benzenediazonium, 4-(N,N-dipropylamino)benzenediazonium, 4-(N-methyl-N-benzylamino)benzenediazonium, 4-(N,N-dibenzylamino)benzenediazonium, 4-(N-ethyl-N-hydroxyethylamino)benzenediazonium, 4-(N,N-diethylamino)-3-methoxybenzenediazonium, 4-(N,N-dimethylamino)-2-methoxybenzenediazonium, 4-(N-benzoylamino)-2,5-diethoxybenzenediazonium, 4-morpholino-2,5-dibutoxybenzenediazonium, 4-anilinobenzenediazonium, 4-[N-(4-methoxybenzoyl)amino]-2,5-diethoxybenzenediazonium, 4-pyrrolidino-3-ethylbenzenediazonium, 4-[N-(1-methyl-2-(4-methoxyphenoxy)ethyl)-N-hexylamino]-2-hexyloxybenzenediazonium, 4-[N-(2-(4-methoxyphenoxy)ethyl)-N-hexylamino]-2-hexyloxybenzenediazonium, and 2-(1-ethylpropyloxy)-4-[di-(di-n-butylaminocarbonylmethyl)amino]benzenediazonium, and the like.

The maximum absorption wavelength ($\lambda_{max}$) of the diazonium salt compound used in the present invention is preferably 450 nm or less in view of the effect, and more preferably from 290 to 440 nm. It is undesirable if the diazonium salt compound possesses $\lambda_{max}$ at the side of a wavelength longer than the above range in view of the deterioration of storability of the material. On the other hand, it is also undesirable if the diazonium salt compound possesses $\lambda_{max}$ at the side of a wavelength shorter than the above range in view of reductions in the image fixing characteristics, image preservation characteristics, and hues a violet to cyan developed when it is used in combination with the coupler.

Also, it is desirable for the diazonium salt compound used in the present invention to have 12 or more carbon atoms, a water solubility of 1% or less, and a solubility in ethyl acetate of 5% or more.

Among these diazonium salt compounds, the diazonium salt compounds represented by the following general formulae (2), (3), and (4) are desirable in view of the hue of dyes, image preservation characteristics, and image fixing characteristics.

General formula (2)

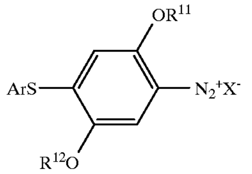

General formula (3)

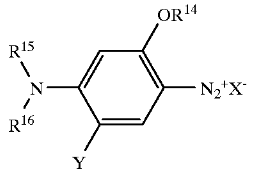

General formula (4)

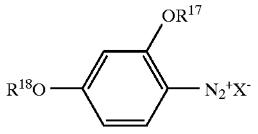

In the general formula (2), Ar represents a substituted or unsubstituted aryl group. Examples of the substituents include an alkyl group, alkoxy group, alkylthio group, aryl group, aryloxy group, arylthio group, acyl group, alkoxycarbonyl group, carbamoyl group, carboamido group, sulfonyl group, sulfamoyl group, sulfonamido group, ureido group, halogen group, amino group, and heterocyclic group, and the like. These substituents may be further substituted.

The aryl group has preferably 6–30 carbon atoms. Examples of these aryl groups include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy)phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy) phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, and 4-(N-benzyl-N-methylamino)-2-dodecyloxycarbonylphenyl group, and the like, though they are not limited to these groups. In addition, these compounds may be further substituted with an alkyloxy group, alkylthio group, substituted phenyl group, cyano group, substituted amino group, halogen atom, heterocyclic group, or the like.

$R^{11}$ and $R^{12}$ respectively represent a substituted or an unsubstituted alkyl group or a substituted or an unsubstituted aryl group. $R^{11}$ and $R^{12}$ may be either the same or different from each other. Examples of the substituents include an alkoxy group, alkoxycarbonyl group, alkylsulfonyl group, substituted amino group, substituted amide group, aryl group, and aryloxy group, and the like, though they are not limited to these groups.

Preferable examples of the alkyl group, which has preferably 1–18 carbon atoms, include a methyl group, trifluoromethyl group, ethyl group, propyl group, isopropyl group, butyl group, sec-butyl group, t-butyl group, pentyl group, isopentyl group, cyclopentyl group, hexyl group, cyclohexyl group, octyl group, t-octyl group, 2-ethylhexyl group, nonyl group, octadecyl group, benzyl group, 4-methoxybenzyl group, triphenylmethyl group, ethoxycarbonylmethyl group, butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, ethoxycarbonylpropyl group, 1-(2',4'-di-t-amylphenyloxy) propyl group, acetylaminoethyl group, 2-(N,N-dimethylamino)ethyl group, 2-(N,N-diethylamino)propyl group, methanesulfonylaminopropyl group, acetylaminoethyl group, 2-(N,N-dimethylamino)ethyl group, and 2-(N,N-diethylamino)propyl group, and the like.

Examples of the aryl group, which has preferably 6–30 carbon atoms, include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl) thio-2,5-butoxyphenyl group, and 4-(N-benzyl-N-methylamino)-2-dodecyoxycarbonylphenyl group, and the like, though they are not limited to these groups. In addition, these groups may be further substituted with an alkyloxy group, alkylthio group, substituted phenyl group, cyano group, substituted amino group, halogen atom, heterocyclic group, or the like.

In the general formula (3), $R^{14}$, $R^{15}$, and $R^{16}$ each represents a substituted or an unsubstituted alkyl group or a substituted or an unsubstituted aryl group. $R^{14}$, $R^{15}$, and $R^{16}$ may be either the same or different from each other. Examples of the substituents include an alkyl group, alkoxy group, alkylthio group, aryl group, aryloxy group, arylthio group, acyl group, alkoxycarbonyl group, carbamoyl group, carboamido group, sulfonyl group, sulfamoyl group, sulfonamido group, ureido group, halogen atom, amino group, and heterocyclic group, and the like.

Preferable examples of the alkyl group, which has preferably 1–18 carbon atoms, include a methyl group, trifluoromethyl group, ethyl group, propyl group, isopropyl group, butyl group, sec-butyl group, t-butyl group, pentyl group, isopentyl group, cyclopentyl group, hexyl group, cyclohexyl group, octyl group, t-octyl group, 2-ethylhexyl group, nonyl group, octadecyl group, benzyl group, 4-methoxybenzyl group, triphenylmethyl group, ethoxycarbonylmethyl group, butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, ethoxycarbonylpropyl group, 1-(2',4'-di-t-amylphenyloxy) propyl group, acetylaminoethyl group, 2-(N,N-dimethylamino)ethyl group, 2-(N,N-diethylamino)propyl group, methanesulfonylaminopropyl group, acetylaminoethyl group, 2-(N, N-dimethylamino) ethyl group, 2-(N,N-diethylamino)propyl group, 1-methyl-2-(4-methoxyphenoxy)ethyl group, di-n-butylaminocarbonylmethyl group, and di-n-octylaminocarbonylmethyl group, and the like.

Examples of the aryl group, which has preferably 6–30 carbon atoms, include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl) thio-2,5-butoxyphenyl group, and 4-(N-benzyl-N-methylamino)-2-dodecyoxycarbonylphenyl group, and the like, though they are not limited to these groups. In addition, these groups may be further substituted with an alkyloxy group, alkylthio group, substituted phenyl group, cyano group, substituted amino group, halogen atom, heterocyclic group, or the like.

Y represents a hydrogen atom or a group —$OR^{13}$. In the group —$OR^{13}$, $R^{13}$ represents a substituted or an unsubstituted alkyl group or a substituted or an unsubstituted aryl group. Examples of the substituents include an alkyl group, alkoxy group, alkylthio group, aryl group, aryloxy group, arylthio group, acyl group, alkoxycarbonyl group, carbamoyl group, carboamido group, sulfonyl group, sulfamoyl group, sulfonamido group, ureido group, halogen atom, amino group, and heterocyclic group, and the like. Y is preferably a hydrogen atom or an alkyloxy group, in which the group $R^{13}$ is an alkyl group, with a view to adjusting the color hue.

Preferable examples of the alkyl group, which has preferably 1–18 carbon atoms, include a methyl group, trifluoromethyl group, ethyl group, propyl group, isopropyl group, butyl group, sec-butyl group, t-butyl group, pentyl group, isopentyl group, cyclopentyl group, hexyl group, cyclohexyl group, octyl group, t-octyl group, 2-ethylhexyl group, nonyl group, octadecyl group, benzyl group, 4-methoxybenzyl group, triphenylmethyl group, ethoxycarbonylmethyl group, butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, ethoxycarbonylpropyl group, 1-(2',4'-di-t-amylphenyloxy) propyl group, acetylaminoethyl group, 2-(N,N-dimethylamino)ethyl group, 2-(N,N-diethylamino)propyl group, methanesulfonylaminopropyl group, acetylaminoethyl group, 2-(N,N-dimethylamino) ethyl group, and 2-(N, N-diethylamino)propyl group, and the like.

Examples of the aryl group, which has preferably 6–30 carbon atoms, include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4-(4-methylphenyl)thio-2,5-butoxyphenyl group, and 4-(N-benzyl-N-methylamino)-2-dodecyoxycarbonylphenyl group, and the like, though they are not limited to these groups. In addition, these groups may be further substituted with an alkyloxy group, alkylthio group, substituted phenyl group, cyano group, substituted amino group, halogen atom, heterocyclic group, or the like.

In the general formula (4), $R^{17}$ and $R^{18}$ each represents a substituted or an unsubstituted alkyl group or a substituted or an unsubstituted aryl group. $R^{17}$ and $R^{18}$ may be either the same or different from each other. Examples of the substituents include an alkyl group, alkoxy group, alkylthio group, aryl group, aryloxy group, arylthio group, acyl group, alkoxycarbonyl group, carbamoyl group, carboamido group, sulfonyl group, sulfamoyl group, sulfonamido group, ureido group, halogen atom, amino group, and heterocyclic group, and the like.

Preferable examples of the alkyl group, which has preferably 1–18 carbon atoms, include a methyl group, trifluoromethyl group, ethyl group, propyl group, isopropyl group, butyl group, sec-butyl group, t-butyl group, pentyl group, isopentyl group, cyclopentyl group, hexyl group, cyclohexyl group, octyl group, t-octyl group, 2-ethylhexyl group, nonyl group, octadecyl group, benzyl group, 4-methoxybenzyl group, triphenylmethyl group, ethoxycarbonylmethyl group, butoxycarbonylmethyl group, 2-ethylhexyloxycarbonylmethyl group, 2',4'-diisopentylphenyloxymethyl group, 2',4'-di-t-butylphenyloxymethyl group, dibenzylaminocarbonylmethyl group, 2,4-di-t-amylphenyloxypropyl group, ethoxycarbonylpropyl group, 1-(2',4'-di-t-amylphenyloxy) propyl group, acetylaminoethyl group, 2-(N,N-dimethylamino)ethyl group, 2-(N,N-diethylamino)propyl group, methanesulfonylaminopropyl group, acetylaminoethyl group, 2-(N,N-dimethylamino) ethyl group, and 2-(N, N-diethylamino)propyl group, and the like, though examples are not limited to these groups.

Examples of the aryl groups, which has preferably 6–30 carbon atoms, include a phenyl group, 2-methylphenyl group, 2-chlorophenyl group, 2-methoxyphenyl group, 2-butoxyphenyl group, 2-(2-ethylhexyloxy)phenyl group, 2-octyloxyphenyl group, 3-(2,4-di-t-pentylphenoxyethoxy) phenyl group, 4-chlorophenyl group, 2,5-dichlorophenyl group, 2,4,6-trimethylphenyl group, 3-chlorophenyl group, 3-methylphenyl group, 3-methoxyphenyl group, 3-butoxyphenyl group, 3-cyanophenyl group, 3-(2-ethylhexyloxy)phenyl group, 3,4-dichlorophenyl group, 3,5-dichlorophenyl group, 3,4-dimethoxyphenyl group, 3-(dibutylaminocarbonylmethoxy)phenyl group, 4-cyanophenyl group, 4-methylphenyl group, 4-methoxyphenyl group, 4-butoxyphenyl group, 4-(2-ethylhexyloxy)phenyl group, 4-benzylphenyl group, 4-aminosulfonylphenyl group, 4-N,N-dibutylaminosulfonylphenyl group, 4-ethoxycarbonylphenyl group, 4-(2-ethylhexylcarbonyl) phenyl group, 4-fluorophenyl group, 3-acetylphenyl group, 2-acetylaminophenyl group, 4-(4-chlorophenylthio)phenyl group, 4- (4-methylphenyl)thio-2,5-butoxyphenyl group, and 4-(N-benzyl-N-methylamino)-2-dodecyoxycarbonylphenyl group, and the like. These groups maybe further substituted with an alkyloxy group, alkylthio group, substituted phenyl group, cyano group, substituted amino group, halogen atom, heterocyclic group, or the like.

In the general formulae (2), (3), and (4), the group $X^-$ represents an acid anion. Examples of the acid anion include polyfluoroalkylcarboxylic acid having 1–9 carbon atoms, polyfluoroalkylsulfonic acid having 1–9 carbon atoms, boron tetrafluoride, tetraphenyl boron, hexafluorophosphoric acid, aromatic carboxylic acid, and aromatic sulphonic acid, and the like. Among these, hexafluorophosphoric acid is preferred in view of crystallinity.

Specific examples of the diazonium salt compound represented by the general formula (2), (3) or (4) are now explained in the following, though they are not limited to those compounds.

(2)-1

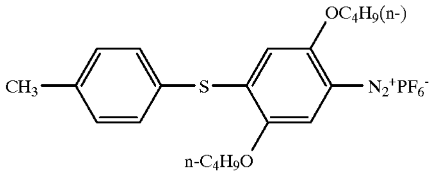

(2)-2

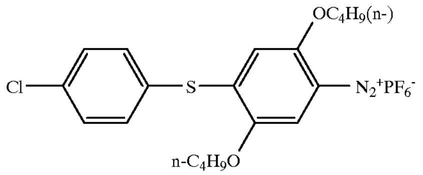

(2)-3

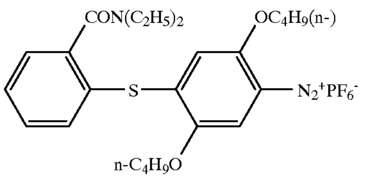

-continued (2)-4

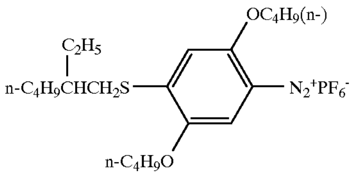

(3)-1

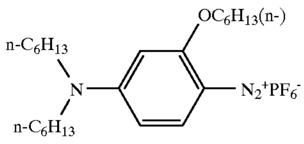

(3)-2

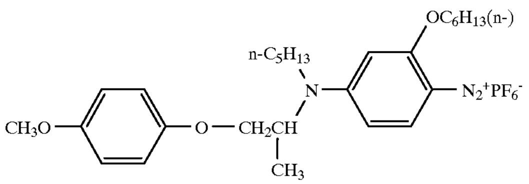

(3)-3

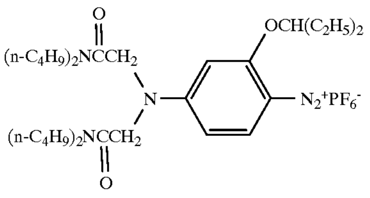

(3)-4

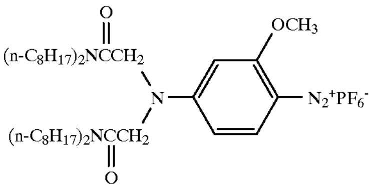

(3)-5

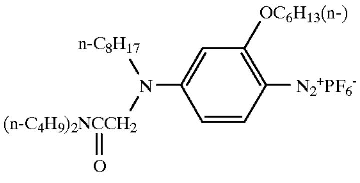

(3)-6

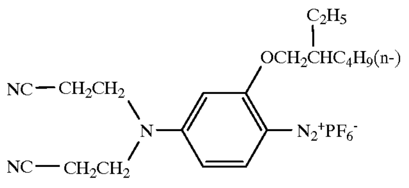

-continued (3)-7

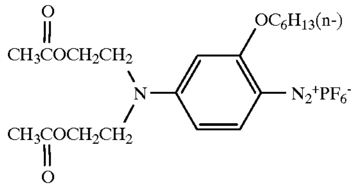

(3)-7

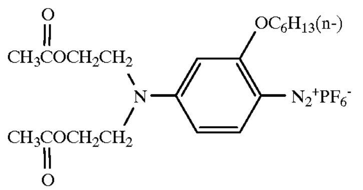

(3)-8

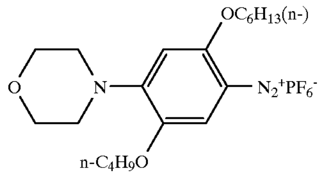

(3)-9

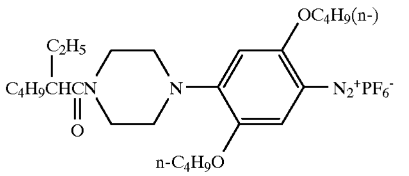

(3)-10

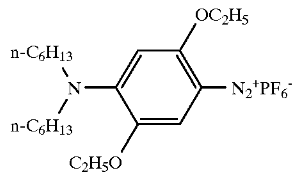

(4)-1

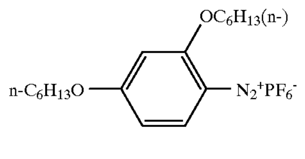

In this invention, the diazonium salt compounds represented by the general formulae (2) , (3), and (4) may be used either independently or in combinations of two or more. Conventional diazonium salt compounds may be used in combination with the diazonium salt compounds represented by the general formula (2), (3), or (4) depending on various objects such as color hue adjustment and the like.

The diazonium compound used in the present invention is contained in an amount preferably from 0.02 to 3 g/$m^2$, and more preferably from 0.1 to 2 g/$m^2$, in the heat-sensitive recording layer.

It is desirable that the diazonium salt compound used in the present invention be encapsulated in a microcapsule in view of storability. There are no limitations to a method for microencapsulation and microencapsules can be formed through a conventionally known method using a wall material such as gelatin, polyurea, polyurethane, polyimide, polyester, polycarbonate, melamine, or the like. The details of the method for microencapsulation are described in Japanese Patent Application Laid-Open (JP-A) No.2-141279 and the like. An organic solvent having a high boiling point may be used as a solvent for dispersing the diazonium salt compound in the course of microencapsulation. There are no specific limitations to the organic solvent and conventionally known organic solvents such as an alkyl phthalate, phosphate, citrate, benzoate, alkylamide, aliphatic ester, trimesate, and the like can be used. The details of these organic solvents are described in Japanese Patent Application Laid-Open (JP-A) No. 7-17145 and the like.

In the present invention, it is desirable to use organic bases such as tertiary amines, piperidines, piperazines, amidines, formamidines, pyridines, guanidines, morpholines, or the like in order to promote the coupling reaction.

Specific examples of these organic bases include piperazines such as N,N'-bis(3-phenoxy-2-hydroxypropyl) piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine, 1,4-bis{[3-(N-methylpiperazino)-2-hydroxy]propyloxy}benzene, and the like; morpholines such as N-[3-(β-naphthoxy)-2-hydroxy]propylmorpholine, 1,4-bis[(3-morpholino-2-hydroxy)propyloxy]benzene, 1,3-bis[(3-morpholino-2-hydroxy)propyloxy]benzene, and the like; piperidines such as N-(3-phenoxy-2-hydroxypropyl)piperidine, N-dodecylpiperidine, and the like; triphenylguanidine, tricyclohexylguanidine, dicyclohexylphenylguanidine, 2-N-methyl-N-benzylaminoethyl-4-hydroxybenzoate, 2-N,N-di-n-butylaminoethyl-4-hydroxybenzoate, 4-(3-N,N-dibutylaminopropoxy)benzenesulfonamide, and 4-(2-N,N-dibutylaminoethoxycarbonyl)phenoxyacetamide amide, and the like. The details of these compounds are described in Japanese Patent Application Laid-Open (JP-A) Nos. 57-123086, 60-49991, and 60-94381, Japanese Patent Application Nos. 7-228731, 7-235157, and 7-235158, and the like. These organic bases may be used either singly or in combinations of two or more. It is preferable that the amount of the organic base be in the range of 1 to 30 mols for 1 mol of the diazonium salt compound, though there is no limitation to the amount of the organic base used in the present invention.

The coupler of the present invention may be used after it is mixed with a water soluble polymer and other components and solid-dispersed with a sandmill or the like. Also, the coupler may be combined with an appropriate emulsifying adjuvant and used in the form of an emulsion. There are no limitations to the methods for solid dispersion and emulsification and conventionally known methods may be used. These methods are described in detail in Japanese Patent Application Laid-Open (JP-A) Nos. 59-190886, 2-141279, and 7-17145.

In the present invention, in addition to the pyrrolopyrimidine compounds represented by the general formula (1), color developing adjuvants may be added for the purpose of promoting a color developing reaction. Examples of these color developing adjuvants include phenol derivatives, naphthol derivatives, alkoxy substituted benzenes, alkoxy substituted naphthalenes, hydroxy compounds, carboxylic acid amide compounds, and sulfonamide compounds, and the like. It is considered that these compounds serve to lower the melting point of the coupler or the basic compound or to increase the thermal transmittance of the wall of the microcapsule, thereby providing a highly developed color density.

For the heat-sensitive recording material of the present invention, a coating solution containing the diazonium salt compound, the pyrrolopyrimidine compound represented by the general formula (1), and other additives is prepared and applied onto a substrate made of paper, a synthetic resin film, or the like by means of a coating process such as bar coating, blade coating, air-knife coating, gravure coating, roll coating, spray coating, dip coating, curtain coating, or the like, followed by drying to form a heat-sensitive recording layer containing a solid component of 2 to 30 $g/m^2$.

As the binder used in the present invention, a conventionally known binder such as polyvinyl alcohol, hydroxyethyl cellulose, methyl cellulose, carboxymethyl cellulose, gelatin, styrene-acrylic acid copolymers, or the like can be used, though there are no limitations to compounds used as the binder. The details of the binder are described in Japanese Patent Application Laid-Open (JP-A) No. 2-141279 and the like. The composition of the present invention may include, as required, various organic or inorganic pigments, various stabilizing agents, antioxidants, and the like other than the aforementioned components.

In the heat-sensitive recording material of the present invention, the diazonium salt compound, pyrrolopyrimidine compound represented by the general formula (1), and the like may be contained either in the same layer or in separated layers to constitute a laminate structure.

As the substrate used in the present invention, conventionally known support materials may be used. Specific examples of the substrates include neutral paper, acid paper, recycled paper, polyolefin resin laminate paper, synthetic paper, polyester films, cellulose derivative films such as a cellulose triacetate film and the like, polystyrene films, polyolefin films such as a polypropylene film, polyethylene film, and the like. These materials may be used either singly or in combinations of two or more bound together. The thickness of the substrate used in the present invention is from 20 to 200 $\mu$m. In addition, an intermediate layer may be interposed between the substrate and the heat-sensitive recording layer as described in Japanese Patent Application Laid-Open (JP-A) No. 61-54980 and the like.

In the heat-sensitive recording material of the present invention, it is desirable to form a protective layer on the heat-sensitive recording layer and it is more desirable to laminate a plurality of protective layers. This protective layer is constituted of a water-soluble polymer compound and pigments, and the like. It is preferable to allow the protective layer to include a compound having a UV ray-transmittance control function to obtain both light fastness and light-fixing characteristics. The details of the heat-sensitive recording material containing the compound having a UV ray-transmittance control function are described in Japanese Patent Application Laid-Open (JP-A) No. 7-276808.

The heat-sensitive recording material of the present invention can be used as multicolor heat-sensitive recording materials. This multicolor heat-sensitive recording material is explained in Japanese Patent Application Laid-Open (JP-A) Nos. 4-135787, 4-144784, 4-144785, 4-194842, 4-247447, 4-247448, 4-340540, 4-340541, 5-34860, and the like. Specifically, the heat-sensitive recording material can be obtained by laminating heat-sensitive recording layers which develop different colors. Though there are no limitations to the layer structure, an example of the layer structure is that of a multicolor heat-sensitive recording material. In this multicolor heat-sensitive recording material, two layers (layers B and C) in which two kinds of diazonium salt compounds having different sensitized wavelengths are combined with couplers, which react respectively with each of the diazonium salt compounds at the time of heating to develop different colors, and a heat-sensitive recording layer (layer A) containing a combination of an electron donating colorless dye and an electron accepting compound are laminated to each other. More specifically, the heat-sensitive recording material is composed of a substrate; a first heat-sensitive recording layer (layer A) containing, an electron donating colorless dye and an electron accepting compound, substrate; a second heat-sensitive recording layer (layer B) containing a diazonium salt compound having a maximum absorption at a wavelength of 360 nm±20 nm and a coupler which reacts with the diazonium salt compound upon heating to develop a color; and a third heat-sensitive recording layer (layer C) containing a diazonium salt compound having a maximum absorption at a wavelength of 400 nm±20 nm and a coupler which reacts with the diazonium salt compound upon heating to develop a color. In this example, if the colors to be developed of heat-sensitive recording layers are selected respectively to be yellow, magenta, and cyan, which are three primary colors in subtractive color mixing, full color image recording can be achieved.

Explaining a recording method using this multicolor heat-sensitive recording material, firstly the third heat-sensitive recording layer (layer C) is heated to allow the diazonium salt and the coupler to develop a color. Then, light of a wavelength of 400±20 nm is applied to decompose the unreacted diazonium salt compound contained in the layer C and thereby to carry out its light-fixing. After this, sufficient heat is applied to the second heat-sensitive recording layer (layer B) to develop a color, thereby allowing the diazonium salt and the coupler to develop a color. Though the layer C is strongly heated at the same time, the diazonium salt compound has already decomposed (light-fixed) to lose its color developing capabilities and hence the layer C does not develop a color. Then, light of a wavelength of 360±20 nm is applied to decompose the diazonium salt compound contained in the layer B. Finally, sufficient heat is applied to the first heat-sensitive recording layer (layer A) to develop a color thereby allowing the layer A to develop a color. Though the heat-sensitive recording layers C and B are strongly heated at the same time, the diazonium salt compounds have already decomposed to lose their color developing capabilities and hence they do not develop a color.

In addition, all of the heat-sensitive recording layers (layer A, layer B, and layer C in this order from the top) may be composed of heat-sensitive recording layers in which three kinds of diazonium salt compound having different light-sensitive wavelengths are combined with couplers, which react respectively with each of the diazonium salt compounds upon heating to develop different colors. Such a layer structure is required especially in the case where a yellow layer, which is low in visibility factor, is used as the bottom layer to reduce the influence of the surface roughness of the substrate on image quality and thereby to improve the quality of images. If all of the heat-sensitive recording layers (layers A, B, and C) are each formed of a diazo-type heat-sensitive recording layer, it is necessary to carry out the light-fixing for the layers A and B after these layers have developed their colors, though it is unnecessary to carry out the light-fixing for the layer C.

As a fixing light source used for the above light- fixing, various fluorescent lamps, a xenon lamp, a mercury lamp, or the like can be used. It is desirable that the emission spectrum of the fixing light source almost coincides with the absorption spectrum of the diazonium salt compound used for the heat-sensitive recording material, because light-fixing can be performed in an efficient manner.

Further, the heat-sensitive recording material of the present invention, when recording onto it, can be used as a heat-developing type light-sensitive material adopted in such a method of exposing the light-sensitive material through an original to decompose diazonium salt compounds other than the image forming portion and thereby to form a latent image and then heating the entire material to heat-develop and thereby to produce an image.

The pyrrolopyrimidine compound represented by the general formula (1) can be synthesized by a known method. For example, a synthetic example of the exemplified coupler (Concrete Example (16)) is described in the following:

Synthetic Example: Synthesis of Concrete Example (16)

2-aminoacetophenone chloride and malononitrile were condensed in the presence of an alkali to prepare 2-amino-3-cyano-4-phenylpyrrole. Next, 18.3 g of the prepared 2-amino-3-cyano-4-phenylpyrrole, 52.2 g of methyl 9,10-heptadecenylcarbonyl acetate, and 23.9 g of ammonium acetate were dispersed in 100 ml of toluene and the mixture was refluxed under heat for 3 hours. To the resulting mixture, which was cooled, was added acetonitrile to crystallize. The deposited crystal was collected by filtration and washed with water and methanol to obtain a target compound (Concrete Example (16)) in an amount of 29.8

EXAMPLES

The present invention will be explained in more detail by way of examples, which do not limit the present invention. In these examples, all designations of "parts" represent parts by weight unless otherwise described.

<Example 1>

<Preparation of a microcapsule solution A>

2.8 parts of diazonium salt (the exemplified compound (3)-2, the maximum absorption wavelength: 370 nm) and 10 parts of tricresyl phosphate were added to 19 parts of ethyl acetate and uniformly mixed. Next, 7.6 parts of Takenate D-110N (manufactured by Takeda Chemical Industries, Ltd.) as a wall material was added to the mixed solution and uniformly mixed to prepare a solution I.

Next, 46 parts of an aqueous solution containing 8% by weight of phthalated gelatin, 17.5 parts of water, and 2 parts of an aqueous 10% solution of sodium dodecylbenzene sulfonate were added to the solution I and the mixture was emulsified at 40° C. for 10 minutes at 10,000 rpm. 20 parts of water was added to the resulting emulsion and made homogeneous. This was followed by performing a microencapsulation reaction at 40° C. for 3 hours while stirring, to obtain a microcapsule solution A. The average particle diameter of the microcapsule was from 0.7 to 0.8 $\mu$m.

<Preparation of a coupler emulsion B>

3.0 parts of a coupler (the exemplified Example (16)), 3.0 parts of triphenylguanidine, 0.5 parts of tricresyl phosphate, and 0.24 parts of diethyl maleate were dissolved in 10.5 parts of ethyl acetate to prepare a solution II.

Next, the solution II was added to a mixed solution which was produced by uniformly mixing 49 parts of an aqueous solution containing 15% by weight of lime-processed gelatin, 9.5 parts of an aqueous solution containing 10% of sodium dodecylbenzene sulfonate, and 35 parts of water at 40° C. The mixture was homogenized at 40° C. for 10 minutes at 10,000 rpm using a homogenizer. The resulting emulsion was stirred at 40° C. for 2 hours and ethyl acetate was removed by evaporation. Then, water was added by an amount corresponding to the amounts of ethyl acetate and water, which were removed by evaporation, to prepare a coupler emulsion B.

<Preparation of a coating solution C for a heat-sensitive recording layer>

3.6 parts of the microcapsule solution A, 3.3 parts of water, and 9.5 parts of the coupler emulsion B were uniformly mixed to prepare a coating solution C for a heat-sensitive recording layer.

<Preparation of a coating solution D for a protective layer>

15 parts of a dispersion solution containing 40% of zinc stearate (trademark: Hydrin Z, manufactured by Chukyo Oil & Fats Co., Ltd.) was uniformly mixed with a solution in which 100 parts of an aqueous 6% solution of itaconic acid modified polyvinyl alcohol (trademark: KL-318, manufactured by Kuraray Co., Ltd.) and 10 parts of a dispersion solution containing 30% of epoxy modified polyamide (trademark: FL-71, manufactured by Toho Chemical Co., Ltd.) were mixed to obtain a coating solution D for a protective layer.

<Coating>

A substrate for photographic printing paper, which was produced by laminating polyethylene on wood free paper was coated, using a wire bar, with the solution C for a heat-sensitive recording layer and the solution D for a protective layer in this order, each coating being followed by drying at 50° C., to obtain a target heat-sensitive recording material. The amounts of the coatings were respectively 8.0 $g/m^2$ and 1.2 $g/m^2$.

<Color developing test>

A thermal head (KST-type, manufactured by Kyocera Corporation) was used to perform thermal printing after setting the power to be applied and pulse width for the thermal head so that the recording energy per unit area of a sample was 50 $mJ/mm^2$. Then the sample was irradiated for 15 seconds with light from a UV-ray lamp with an emission central wavelength of 365 nm and a power of 40 W. The densities of an image portion and background portion of the resulting sample were measured by a Macbeth densitometer.

<Test for light fastness of an image>

An image portion which was color-developed using a thermal head (KST-type, manufactured by Kyocera Corporation) was continuously irradiated with light at 30,000 lux for 24 hours using a fluorescent lamp light fastness test machine and then the density of the image portion was measured. When the density of the image portion after irradiation with light was higher, it was determined that the light fastness of an image was superior.

<Test for image fixing>

A test for image fixing characteristics was performed according to a method in which the background portion (non-printed portion) of the aforementioned fixed sample was subjected to thermal printing using a thermal head (KST-type, manufactured by Kyocera Corporation) after setting the power to be applied and pulse width for the thermal head so that the recording energy per unit area was 40 $mJ/mm^2$. Variations in its density were inspected. When the density of the image portion after thermal printing is lower, it was determined that the fixing characteristics of an image was superior.

<Example 2>

A heat-sensitive recording material was manufactured and evaluated in the same procedure as in Example 1 except that a coupler (20) was used instead of the coupler (16) used in Example 1 to prepare an emulsion.

<Example 3>

A heat-sensitive recording material was manufactured and evaluated in the same procedure as in Example 1 except that a coupler (21) was used instead of the coupler (16) used in Example 1 to prepare an emulsion.

<Example 4>

A heat-sensitive recording material was manufactured and evaluated in the same procedure as in Example 1 except that a coupler (22) was used instead of the coupler (16) used in Example 1 to prepare an emulsion.

<Example 5>

A heat-sensitive recording material was manufactured and evaluated in the same procedure as in Example 1 except that a coupler (23) was used instead of the coupler (16) used in Example 1 to prepare an emulsion.

<Example 6>

A heat-sensitive recording material was manufactured and evaluated in the same procedure as in Example 1 except that a coupler (24) was used instead of the coupler (16) used in Example 1 to prepare an emulsion <Example 7>

A heat-sensitive recording material was manufactured and evaluated in the same procedure as in Example 1 except that a coupler (25) was used instead of the coupler (16) used in Example 1 to prepare an emulsion.

<Example 8>

A heat-sensitive recording material was manufactured and evaluated in the same procedure as in Example 1 except that a coupler (26) was used instead of the coupler (16) used in Example 1 to prepare an emulsion.

<Example 9>

A heat-sensitive recording material was manufactured and evaluated in the same procedure as in Example 1 except that a coupler (27) was used instead of the coupler (16) used in Example 1 to prepare an emulsion.

<Example 10>

A heat-sensitive recording material was manufactured and evaluated in the same procedure as in Example 1 except that a coupler (28) was used instead of the coupler (16) used in Example 1 to prepare an emulsion.

<Example 11>

A heat-sensitive recording material was manufactured and evaluated in the same procedure as in Example 1 except that a coupler (51) was used instead of the coupler (16) used in Example 1 to prepare an emulsion.

<Example 12>

A heat-sensitive recording material was manufactured and evaluated in the same procedure as in Example 1 except that a coupler (53) was used instead of the coupler (16) used in Example 1 to prepare an emulsion.

<Example 13>

A heat-sensitive recording material was manufactured and evaluated in the same procedure as in Example 1 except that a coupler (55) was used instead of the coupler (16) used in Example 1 to prepare an emulsion.

<Example 14>

A heat-sensitive recording material was manufactured and evaluated in the same procedure as in Example 1 except that a coupler (59) was used instead of the coupler (16) used in Example 1 to prepare an emulsion.

<Example 15>

A heat-sensitive recording material was manufactured and evaluated in the same procedure as in Example 1 except that the exemplified compound (3) -3 (the maximum absorption wavelength of 365 nm) was used instead of the diazonium salt (the exemplified compound (3)-2) used in Example 1 to prepare a microcapsule solution.

<Example 16>

A heat-sensitive recording material was manufactured and evaluated in the same procedure as in Example 15 except that a coupler (41) was used instead of the coupler (16) used in Example 15 to prepare an emulsion.

<Example 17>

A heat-sensitive recording material was manufactured and evaluated in the same procedure as in Example 15 except that a coupler (42) was used instead of the coupler (16) used in Example 15 to prepare an emulsion.

<Example 18>

A heat-sensitive recording material was manufactured and evaluated in the same procedure as in Example 15 except that a coupler (43) was used instead of the coupler (16) used in Example 15 to prepare an emulsion.

<Example 19>

A heat-sensitive recording material was manufactured and evaluated in the same procedure as in Example 15 except that a coupler (44) was used instead of the coupler (16) used in Example 15 to prepare an emulsion.

<Example 20>

A heat-sensitive recording material was manufactured and evaluated in the same procedure as in Example 15 except that a coupler (45) was used instead of the coupler (16) used in Example 15 to prepare an emulsion.

<Example 21>

A heat-sensitive recording material was manufactured and evaluated in the same procedure as in Example 15 except that a coupler (46) was used instead of the coupler (16) used in Example 15 to prepare an emulsion.

<Example 22>

A heat-sensitive recording material was manufactured and evaluated in the same procedure as in Example 15 except that a coupler (47) was used instead of the coupler (16) used in Example 15 to prepare an emulsion.

<Example 23>

A heat-sensitive recording material was manufactured and evaluated in the same procedure as in Example 15 except that a coupler (48) was used instead of the coupler (16) used in Example 15 to prepare an emulsion.

<Example 24>

A heat-sensitive recording material was manufactured and evaluated in the same procedure as in Example 15 except that a coupler (49) was used instead of the coupler (16) used in Example 15 to prepare an emulsion.

<Example 25>

A heat-sensitive recording material was manufactured and evaluated in the same procedure as in Example 15 except that a coupler (50) was used instead of the coupler (16) used in Example 15 to prepare an emulsion.

<Comparative Example>

A heat-sensitive recording material was manufactured and evaluated in the same procedure as in Example 15 except that 2-hydroxy-3-naphthoic acid [3-(2-ethylhexyloxy) anilide] was used instead of the coupler (16) used in Example 15 to prepare an emulsion.

The results of $\lambda_{max}$ of the image portion, light fastness test for an image, and fixing characteristic test are shown in Table 3.

TABLE 3

| Example | Developed color image $\lambda$max (nm) | Image light fastness test Density of image portion Before irradiation | After irradiation | Image fixing characteristic test Density of background Before printing | After printing |
|---|---|---|---|---|---|
| Example 1 | 663 | 1.54 | 1.34 | 0.06 | 0.08 |
| Example 2 | 674 | 1.49 | 1.31 | 0.08 | 0.08 |
| Example 3 | 662 | 1.50 | 1.33 | 0.07 | 0.09 |
| Example 4 | 666 | 1.52 | 1.31 | 0.07 | 0.09 |
| Example 5 | 666 | 1.57 | 1.40 | 0.06 | 0.07 |
| Example 6 | 676 | 1.31 | 1.14 | 0.06 | 0.07 |
| Example 7 | 669 | 1.38 | 1.13 | 0.08 | 0.09 |
| Example 8 | 669 | 1.40 | 1.21 | 0.07 | 0.09 |
| Example 9 | 672 | 1.29 | 1.10 | 0.07 | 0.09 |
| Example 10 | 685 | 1.26 | 1.09 | 0.07 | 0.08 |
| Example 11 | 662 | 1.51 | 1.23 | 0.06 | 0.08 |
| Example 12 | 638 | 1.22 | 1.08 | 0.11 | 0.13 |
| Example 13 | 675 | 1.51 | 1.29 | 0.12 | 0.13 |
| Example 14 | 640 | 1.24 | 1.08 | 0.07 | 0.08 |
| Example 15 | 633 | 1.40 | 1.22 | 0.07 | 0.07 |
| Example 16 | 661 | 1.46 | 1.28 | 0.11 | 0.13 |
| Example 17 | 663 | 1.38 | 1.21 | 0.12 | 0.13 |
| Example 18 | 648 | 1.33 | 1.20 | 0.07 | 0.08 |
| Example 19 | 654 | 1.34 | 1.21 | 0.07 | 0.07 |
| Example 20 | 676 | 1.38 | 1.25 | 0.13 | 0.15 |
| Example 21 | 676 | 1.40 | 1.24 | 0.07 | 0.07 |
| Example 22 | 652 | 1.37 | 1.23 | 0.07 | 0.08 |
| Example 23 | 654 | 1.41 | 1.22 | 0.07 | 0.07 |
| Example 24 | 673 | 1.42 | 1.26 | 0.13 | 0.15 |
| Example 25 | 658 | 1.31 | 1.17 | 0.07 | 0.07 |
| Comparative Example | 632 | 1.07 | 0.76 | 0.08 | 0.51 |

It is confirmed from these results that the heat- sensitive recording material of a violet to cyan color forming type, in which the pyrrolopyrimidine compound represented by the general formula (1) of the present invention is used as a coupler, has a high developed color density. Also, it is found that the rate of reduction in the density of the image portion is small even after irradiation with light from a fluorescent lamp to show its superiority in light fastness of an image. Further, color density is low when the background portion of the sample after the fixing of an image is again subjected to thermal printing, exhibiting superior image fixing characteristics.

What is claimed is:

1. A heat-sensitive recording material comprising a substrate having thereon a heat-sensitive recording layer containing a diazonium salt compound and a coupler, which reacts with the diazonium salt compound upon heating to develop a color, wherein the coupler includes at least one of pyrrolo[1,2-a] pyrimidine compounds represented by the following general formula (1):

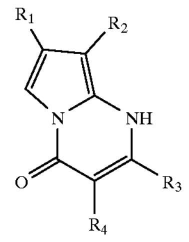

wherein $R^1$ to $R^4$ each represents a hydrogen atom, a halogen atom, an aryl group, an alkyl group, a cyano group, an acyl group, a substituted carbamoyl group, an alkoxycarbonyl group, an aryloxycarbonyl group, an acyloxy group, an alkoxy group, an aryloxy group, an alkylthio group, an arylthio group, a substituted sulfamoyl group, an alkylsulfonyl group, an arylsulfonyl group, an alkylphosphoryl group, an arylphosphoryl group, or a substituted amino group.

2. A heat-sensitive recording material according to claim 1, wherein the maximum absorption wavelength $\lambda_{max}$ of said diazonium salt compound is 450 nm or shorter.

3. A heat-sensitive recording material according to claim 1, wherein said diazonium salt compound is a compound represented by the following general formula (2), (3), or (4):

General formula (2)

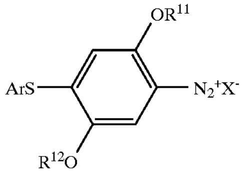

wherein Ar represents a substituted or unsubstituted aryl group, $R^{11}$ and $R^{12}$, which may be the same or different from each other, each represent a substituted or unsubstituted alkyl group or a substituted or unsubstituted aryl group, and $X^-$ represents an acid anion;

General formula (3)

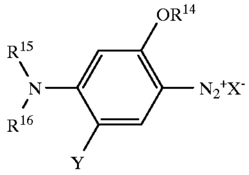

wherein $R^{14}$, $R^{15}$, and $R^{16}$, which may be the same or different from each other, each represents a substituted or unsubstituted alkyl group or a substituted or unsubstituted aryl group, Y represents a hydrogen atom or a group —$OR^{13}$, wherein $R^{13}$ represents a substituted or unsubstituted alkyl group or a substituted or unsubstituted aryl group, and $X^-$ represents an acid anion;

General formula (4)

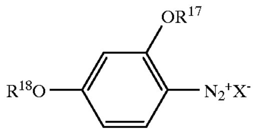

wherein $R^{17}$ and $R^{18}$ each represents a substituted or unsubstituted alkyl group or a substituted or unsubstituted aryl group and $X^-$ represents an acid anion.

4. A heat-sensitive recording material according to claim 3, wherein the maximum absorption wavelength $\lambda_{max}$ of said diazonium salt compound is 450 nm or shorter.

5. A heat-sensitive recording material according to claim 1, wherein said diazonium salt compound is encapsulated in a microcapsule.

6. A heat-sensitive recording material according to claim 5, wherein the capsule wall of said microcapsule includes a polyurethane and/or a polyurea as a structural component.

7. A heat-sensitive recording material according to claim 2, wherein said diazonium salt compound is encapsulated in a microcapsule.

8. A heat-sensitive recording material according to claim 7, wherein the capsule wall of said microcapsule includes a polyurethane and/or a polyurea as a structural component.

9. A heat-sensitive recording material according to claim 3, wherein said diazonium salt compound is encapsulated in a microcapsule.

10. A heat-sensitive recording material according to claim 9, wherein the capsule wall of said microcapsule includes a polyurethane and/or a polyurea as a structural component.

11. A heat-sensitive recording material according to claim 4, wherein said diazonium salt compound is encapsulated in a microcapsule.

12. A heat-sensitive recording material according to claim 11, wherein the capsule wall of said microcapsule includes a polyurethane and/or a polyurea as a structural component.

* * * * *